(12) United States Patent
Pan et al.

(10) Patent No.: US 12,183,637 B2
(45) Date of Patent: Dec. 31, 2024

(54) FIN FIELD-EFFECT TRANSISTOR AND METHOD OF FORMING THE SAME

(71) Applicant: Taiwan Semiconductor Manufacturing Company, Ltd., Hsinchu (TW)

(72) Inventors: Yu-Chi Pan, Zhubei (TW); Kuo-Bin Huang, Jhubei (TW); Ming-Hsi Yeh, Hsinchu (TW); Ying-Liang Chuang, Zhubei (TW); Yu-Te Su, Hsinchu (TW); Kuan-Wei Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/337,855

(22) Filed: Jun. 20, 2023

(65) Prior Publication Data
US 2023/0335443 A1     Oct. 19, 2023

Related U.S. Application Data

(63) Continuation of application No. 17/371,939, filed on Jul. 9, 2021, now Pat. No. 11,715,670.

(51) Int. Cl.
| | | |
|---|---|---|
| *H01L 21/8234* | (2006.01) | |
| *H01L 27/088* | (2006.01) | |
| *H01L 29/49* | (2006.01) | |

(52) U.S. Cl.
CPC ......... *H01L 21/82345* (2013.01); *H01L 21/823431* (2013.01); *H01L 27/0886* (2013.01); *H01L 29/4966* (2013.01)

(58) Field of Classification Search
CPC ....... H01L 21/82345; H01L 21/823431; H01L 27/0886; H01L 29/4966
See application file for complete search history.

(56) References Cited

U.S. PATENT DOCUMENTS

| | | | |
|---|---|---|---|
| 9,524,967 B1 * | 12/2016 | Liu | ........... H01L 21/82345 |
| 2019/0333769 A1 | 10/2019 | Chen et al. | |
| 2021/0057282 A1 * | 2/2021 | Chen | ........... H01L 21/31111 |
| 2022/0052162 A1 | 2/2022 | Lee et al. | |

OTHER PUBLICATIONS

Notice of Allowance on U.S. Appl. No. 17/371,939 dtd Mar. 15, 2023.

* cited by examiner

*Primary Examiner* — Christine A Enad
(74) *Attorney, Agent, or Firm* — FOLEY & LARDNER LLP

(57) ABSTRACT

A method includes depositing a first work function layer over a first and second gate trench. The method includes depositing a second work function layer over the first work function layer. The method includes etching the second work function layer in the first gate trench while covering the second work function layer in the second gate trench, causing the first work function layer in the first gate trench to contain metal dopants that are left from the second work function layer etched in the first gate trench. The method includes forming a first active gate structure and second active gate structure, which include the first work function layer and the metal dopants left from the second work function layer in the first gate trench, and the first work function layer and no metal dopants left behind from the second work function layer, respectively.

20 Claims, 16 Drawing Sheets

300

302

FIN FIELD-EFFECT TRANSISTOR AND METHOD OF FORMING THE SAME

CROSS-REFERENCE TO RELATED APPLICATION

This application is a continuation of U.S. patent application Ser. No. 17/371,939, filed Jul. 9, 2021, which is incorporated by reference herein in its entirety.

BACKGROUND

The present disclosure generally relates to semiconductor devices, and particularly to methods of making a non-planar transistor.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a fin protruding from a substrate. A gate structure, configured to control the flow of charge carriers within a conductive channel of the FinFET device, wraps around the fin. For example, in a tri-gate FinFET device, the gate structure wraps around three sides of the fin, thereby forming conductive channels on three sides of the fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
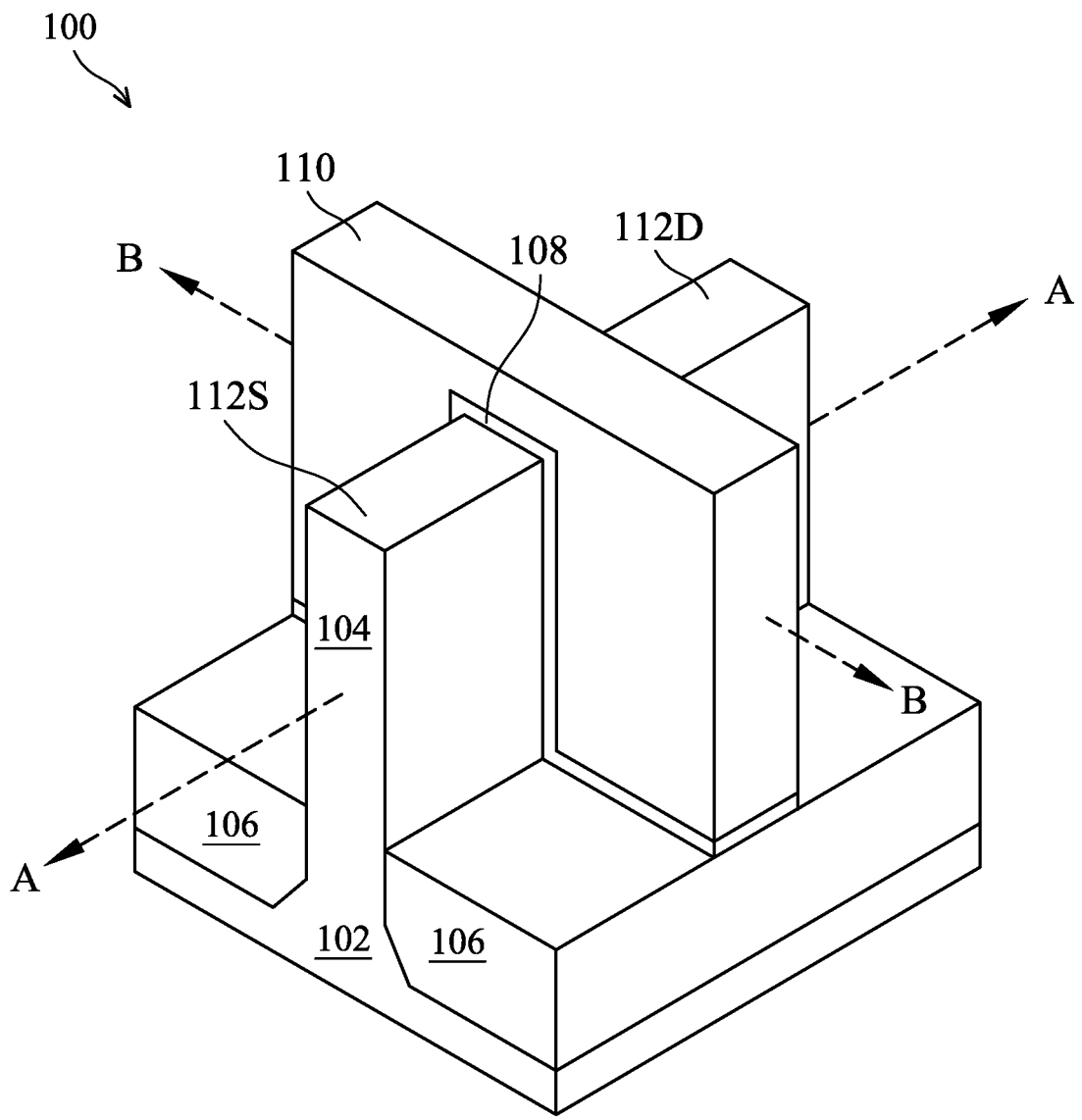
FIG. 1 illustrates a perspective view of a Fin Field-Effect Transistor (FinFET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a FinFET device, and in particular, in the context of forming a replacement gate of a FinFET device. In some embodiments, a number of dummy gate structures are formed over a fin. A gate spacer is formed around each of the dummy gate structures. After an interlayer dielectric (ILD) layer is formed around the gate spacers, the dummy gate structures are removed to form a number of gate trenches. Next, a first work function layer and a second work function layer are sequentially deposited over the gate trenches. By tuning etching conditions to remove the second work function layer across the different gate trenches, the first work function layer may present different concentrations of dopants that are left from the respective second work function layer. As such, a number of active (e.g., metal) gate structures, including the first work function layer with different concentrations of dopants, can be formed to have respective different threshold voltages.

Metal gate structures over a fin formed by the above described method can provide various advantages. In the existing technologies, in order to have multiple threshold voltages, at least a corresponding number of processes depositing different work function layers is needed, which disadvantageously increases processing complexity and cost. Embodiments of the present disclosure include tuning etching conditions on a stack of two different work function layers to remove the upper work function layer so as to cause the lower work function layer to present different concentrations of dopants that are left from the respective upper work function layer. In this way, depositing one stack of two different work function layers can form a number of active gate structures, with respective different threshold voltages, that can be significantly more than 2. Accordingly, the corresponding processing complexity and cost can be advantageously limited.

FIG. 1 illustrates a perspective view of an example FinFET device 100, in accordance with various embodiments. The FinFET device 100 includes a substrate 102 and a fin 104 protruding above the substrate 102. Isolation regions 106 are formed on opposing sides of the fin 104, with the fin 104 protruding above the isolation regions 106. A gate dielectric 108 is along sidewalls and over a top surface of the fin 104, and a gate 110 is over the gate dielectric 108. Source/drain structures 112S and 112D are in (or extended from) the fin 104 and on opposing sides of the gate dielectric 108 and the gate 110. FIG. 1 is provided as a reference to illustrate a number of cross-sections in subsequent figures. For example, cross-section B-B extends along a longitudinal axis of the gate 110 of the FinFET device 100. Cross-section A-A is perpendicular to cross-section B-B and is along a longitudinal axis of the fin 104 and in a direction of, for example, a current flow between the gate 110. Subsequent figures refer to these reference cross-sections for clarity.

Figure 2:
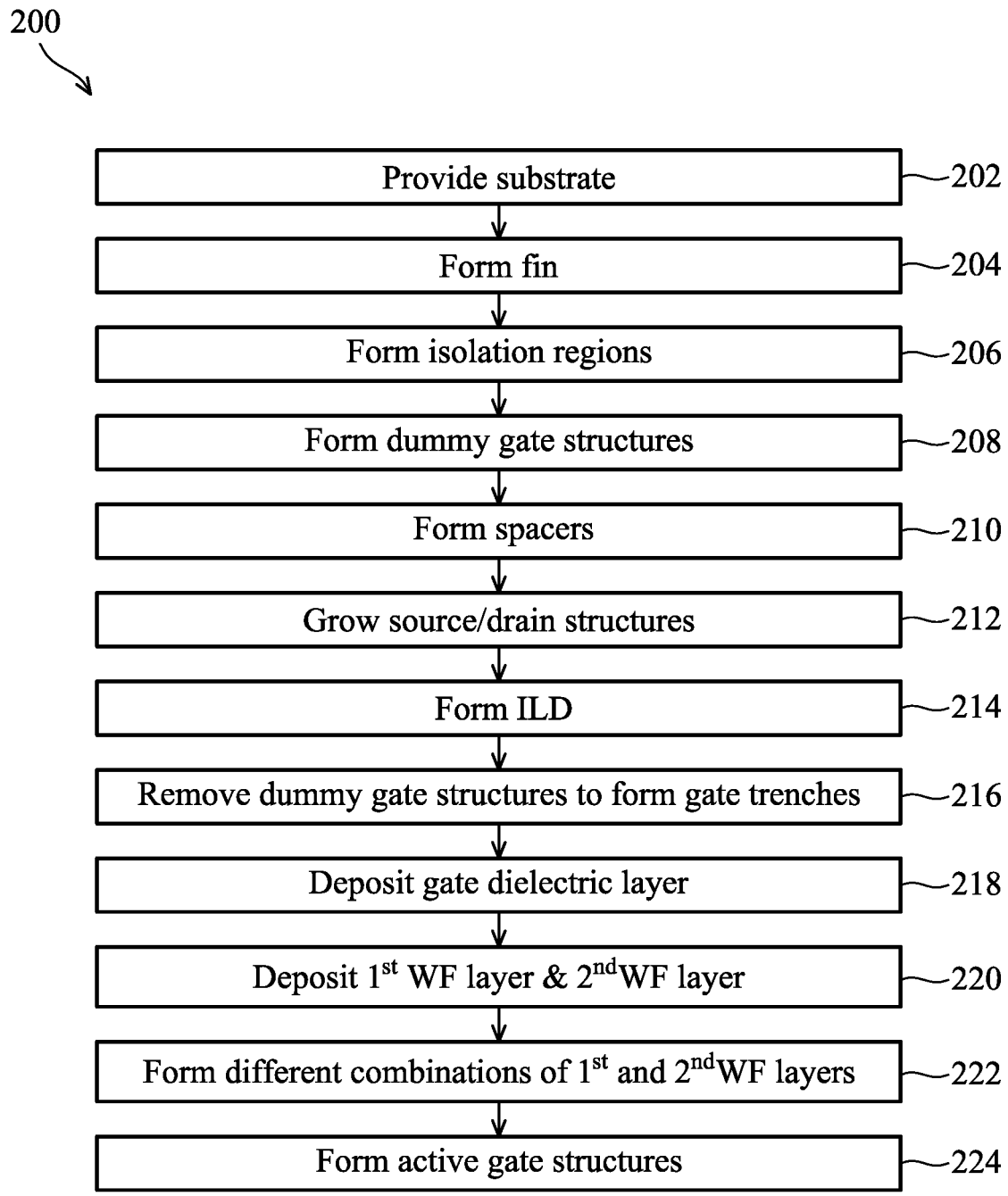
FIG. 2 illustrates a flow chart of an example method for making a non-planar transistor device, in accordance with some embodiments.

FIG. 2 illustrates a flowchart of a method 200 to form a non-planar transistor device, according to one or more embodiments of the present disclosure. For example, at least some of the operations of the method 200 can be used to form a FinFET device (e.g., FinFET device 100), a nanosheet transistor device, a nanowire transistor device, a vertical transistor, or the like. It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with cross-sectional views of an example FinFET device at various fabrication stages as shown in FIGS. 3, 4, 5, 6, 7, 8, 9, 10, 11, 12, 13, 14, 15, and 16, respectively, which will be discussed in further detail below.

In brief overview, the method 200 starts with operation 202 of providing a substrate. The method 200 continues to operation 204 of forming a fin. The method 200 continues to operation 206 of forming isolation regions. The method 200 continues to operation 208 of forming a number of dummy gate structures. The dummy gate structures may each straddle a respective portion of the fin. The method 200 continues to operation 210 of forming gate spacers. The method 200 continues to operation 212 of growing source/drain structures. The method 200 continues to operation 214 of forming an interlayer dielectric (ILD). The method 200 continues to operation 216 of removing the dummy gate structures. Upon the dummy gate structure being removed, a number of gate trenches are formed. The method 200 continues to operation 218 of depositing a gate dielectric layer. The method 200 continues to operation 220 of depositing a first work function layer and a second work function layer. The method 200 continues to operation 222 of forming different combinations of the first and/or second work function layers. Operation 222 may be repeated performed multiple times according to the number of dummy gate structures. The method 200 continues to operation 224 of forming a number of active gate structures.

As mentioned above, FIGS. 3-16 each illustrate, in a cross-sectional view, a portion of a FinFET device 300 at various fabrication stages of the method 200 of FIG. 2. The FinFET device 300 is substantially similar to the FinFET device 100 shown in FIG. 1, but with multiple gate structures. Although FIGS. 3-16 illustrate the FinFET device 300, it is understood the FinFET device 300 may include a number of other devices such as inductors, fuses, capacitors, coils, etc., which are not shown in FIGS. 3-16, for purposes of clarity of illustration.

Figure 3:
FIGS. 3, 4, 5, 6, 7, 8, 9, 10, 11, 12, 13, 14, 15, and 16 illustrate cross-sectional views of an example FinFET device (or a portion of the example FinFET device) during various fabrication stages, made by the method of FIG. 2, in accordance with some embodiments.
Figure 3:
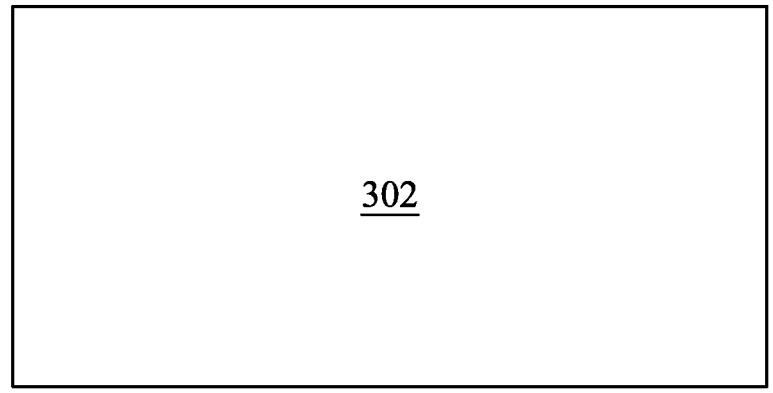

Corresponding to operation 202 of FIG. 2, FIG. 3 is a cross-sectional view of the FinFET device 300 including a semiconductor substrate 302 at one of the various stages of fabrication. The cross-sectional view of FIG. 3 is cut along the lengthwise direction of a dummy or an active gate structure (e.g., cross-section B-B, as indicated in FIG. 1).

The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 4:
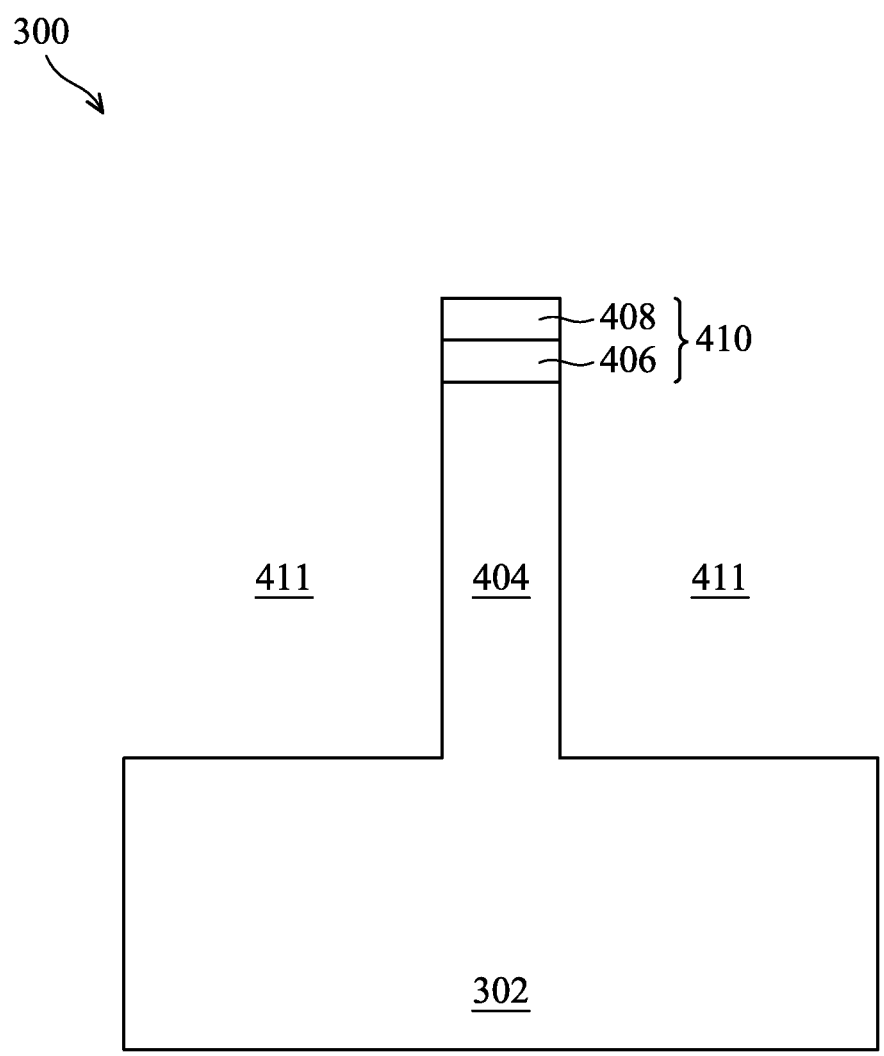

Corresponding to operation 204 of FIG. 2, FIG. 4 is a cross-sectional view of the FinFET device 300 including a (semiconductor) fin 404 at one of the various stages of fabrication. The cross-sectional view of FIG. 4 is cut along the lengthwise direction of a dummy or an active gate structure (e.g., cross-section B-B, as indicated in FIG. 1).

Although one fin is shown in the illustrated embodiment of FIG. 4 (and the following figures), it should be appreciated that the FinFET device 300 can include any number of fins while remaining within the scope of the present disclosure. In some embodiments, the fin 404 is formed by patterning the substrate 302 using, for example, photolithography and etching techniques. For example, a mask layer, such as a pad oxide layer 406 and an overlying pad nitride layer 408, is formed over the substrate 302. The pad oxide layer 406 may be a thin film comprising silicon oxide formed, for example, using a thermal oxidation process. The pad oxide layer 406 may act as an adhesion layer between the substrate 302 and the overlying pad nitride layer 408. In some embodiments, the pad nitride layer 408 is formed of silicon nitride, silicon oxynitride, silicon carbonitride, the like, or combinations thereof. The pad nitride layer 408 may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer 406 and pad nitride layer 408 to form a patterned mask 410, as illustrated in FIG. 4.

The patterned mask 410 is subsequently used to pattern exposed portions of the substrate 302 to form trenches (or openings) 411, thereby defining a fin 404 between adjacent trenches 411 as illustrated in FIG. 4. When multiple fins are formed, such a trench may be disposed between any adjacent ones of the fins. In some embodiments, the fin 404 is formed by etching trenches in the substrate 302 using, for example, reactive ion etch (RIE), neutral beam etch (NBE), the like, or combinations thereof. The etch may be anisotropic. In some embodiments, the trenches 411 may be strips (viewed from the top) parallel to each other, and closely spaced with respect to each other. In some embodiments, the trenches 411 may be continuous and surround the fin 404. The fin 404 may also be referred to as fin 404 hereinafter.

The fin 404 may be patterned by any suitable method. For example, the fin 404 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process.

For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin.

Figure 5:
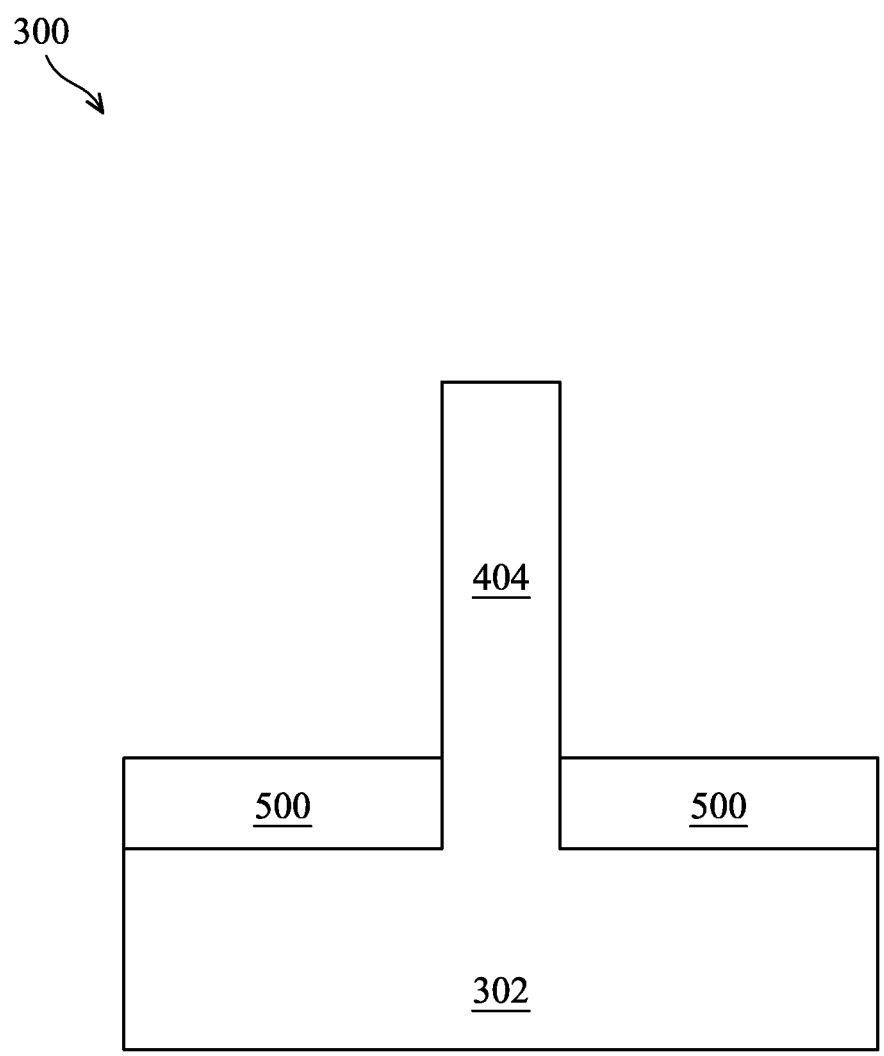

Corresponding to operation 206 of FIG. 2, FIG. 5 is a cross-sectional view of the FinFET device 300 including isolation regions 500 at one of the various stages of fabrication. The cross-sectional view of FIG. 5 is cut along the lengthwise direction of a dummy or an active gate structure (e.g., cross-section B-B, as indicated in FIG. 1).

The isolation regions 500, which is formed of an insulation material, can electrically isolate neighboring fins from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 500 and a top surface of the fin 404 that are coplanar (not shown). The patterned mask 410 (FIG. 4) may also be removed by the planarization process.

In some embodiments, the isolation regions 500 include a liner, e.g., a liner oxide (not shown), at the interface between each of the isolation regions 500 and the substrate 302 (fin 404). In some embodiments, the liner oxide is formed to reduce crystalline defects at the interface between the substrate 302 and the isolation region 500. Similarly, the liner oxide may also be used to reduce crystalline defects at the interface between the fin 404 and the isolation region 500. The liner oxide (e.g., silicon oxide) may be a thermal oxide formed through a thermal oxidation of a surface layer of the substrate 302, although other suitable method may also be used to form the liner oxide.

Next, the isolation regions 500 are recessed to form shallow trench isolation (STI) regions 500, as shown in FIG. 5. The isolation regions 500 are recessed such that the upper portions of the fin 404 protrude from between neighboring STI regions 500. Respective top surfaces of the STI regions 500 may have a flat surface (as illustrated), a convex surface, a concave surface (such as dishing), or combinations thereof. The top surfaces of the STI regions 500 may be formed flat, convex, and/or concave by an appropriate etch. The isolation regions 500 may be recessed using an acceptable etching process, such as one that is selective to the material of the isolation regions 500. For example, a dry etch or a wet etch using dilute hydrofluoric (DHF) acid may be performed to recess the isolation regions 500.

FIGS. 3 through 5 illustrate an embodiment of forming one or more of the fin 404, but a fin may be formed in various different processes. For example, a top portion of the substrate 302 may be replaced by a suitable material, such as an epitaxial material suitable for an intended type (e.g., N-type or P-type) of semiconductor devices to be formed. Thereafter, the substrate 302, with epitaxial material on top, is patterned to form the fin 404 that includes the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form one or more fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form one or more fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fin 404 may include silicon germanium ($Si_xGe_{1-x}$, where x can be between 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 6:
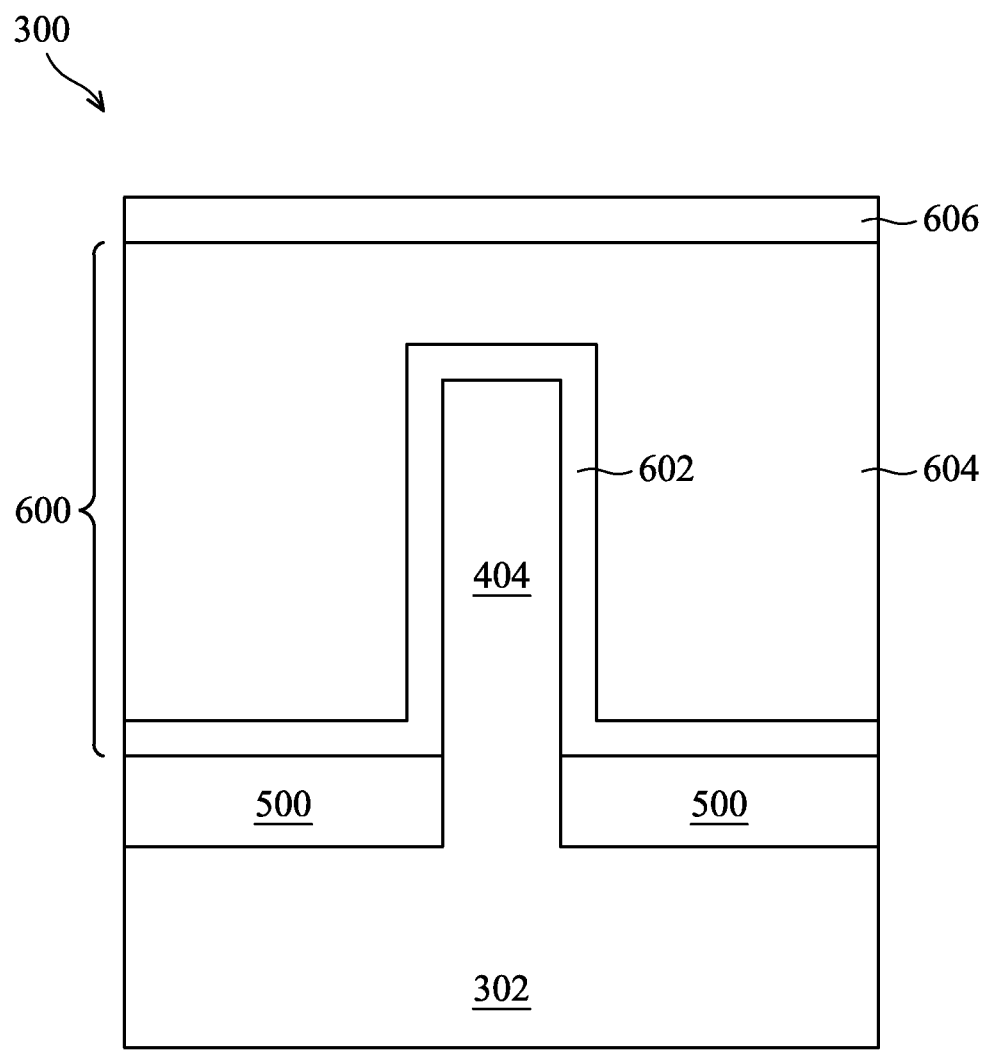

Corresponding to operation 208 of FIG. 2, FIG. 6 is a cross-sectional view of the FinFET device 300 including a dummy gate structure 600 at one of the various stages of fabrication. The cross-sectional view of FIG. 6 is cut along the lengthwise direction of a dummy or an active gate structure (e.g., cross-section B-B, as indicated in FIG. 1).

The dummy gate structure 600 includes a dummy gate dielectric 602 and a dummy gate 604, in some embodiments. A mask 606 may be formed over the dummy gate structure 600. To form the dummy gate structure 600, a dielectric layer is formed on the fin 404. The dielectric layer may be, for example, silicon oxide, silicon nitride, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using acceptable photolithography and etching techniques to form the mask 606. The pattern of the mask 606 then may be transferred to the gate layer and the dielectric layer by an acceptable etching technique to form the dummy gate 604 and the underlying dummy gate dielectric 602, respectively. The dummy gate 604 and the dummy gate dielectric 602 cover a central portion (e.g., a channel region) of the fin 404. The dummy gate 604 may also have a lengthwise direction (e.g., direction B-B of FIG. 1) substantially perpendicular to a lengthwise direction (e.g., direction of A-A of FIG. 1) of the fin 404.

The dummy gate dielectric 602 is shown to be formed over the fin 404 (e.g., over top surfaces and sidewalls of the fin 404) and over the STI regions 500 in the example of FIG.

6. In other embodiments, the dummy gate dielectric 602 may be formed by, e.g., thermal oxidization of a material of the fin 404, and therefore, may be formed over the fin 404 but not over the STI regions 500. It should be appreciated that these and other variations are still included within the scope of the present disclosure.

In brief overview, four dummy gate structures 600A, 600B, 600C, and 600D are illustrated over the fin 404 in the examples of FIGS. 7-16. For simplicity, the dummy gate structures 600A, 600B, 600C, and 600D may sometimes be collectively referred to as dummy gate structures 600. It should be appreciated that more or less than four dummy gate structures can be formed over the fin 404, while remaining within the scope of the present disclosure.

Figure 7:
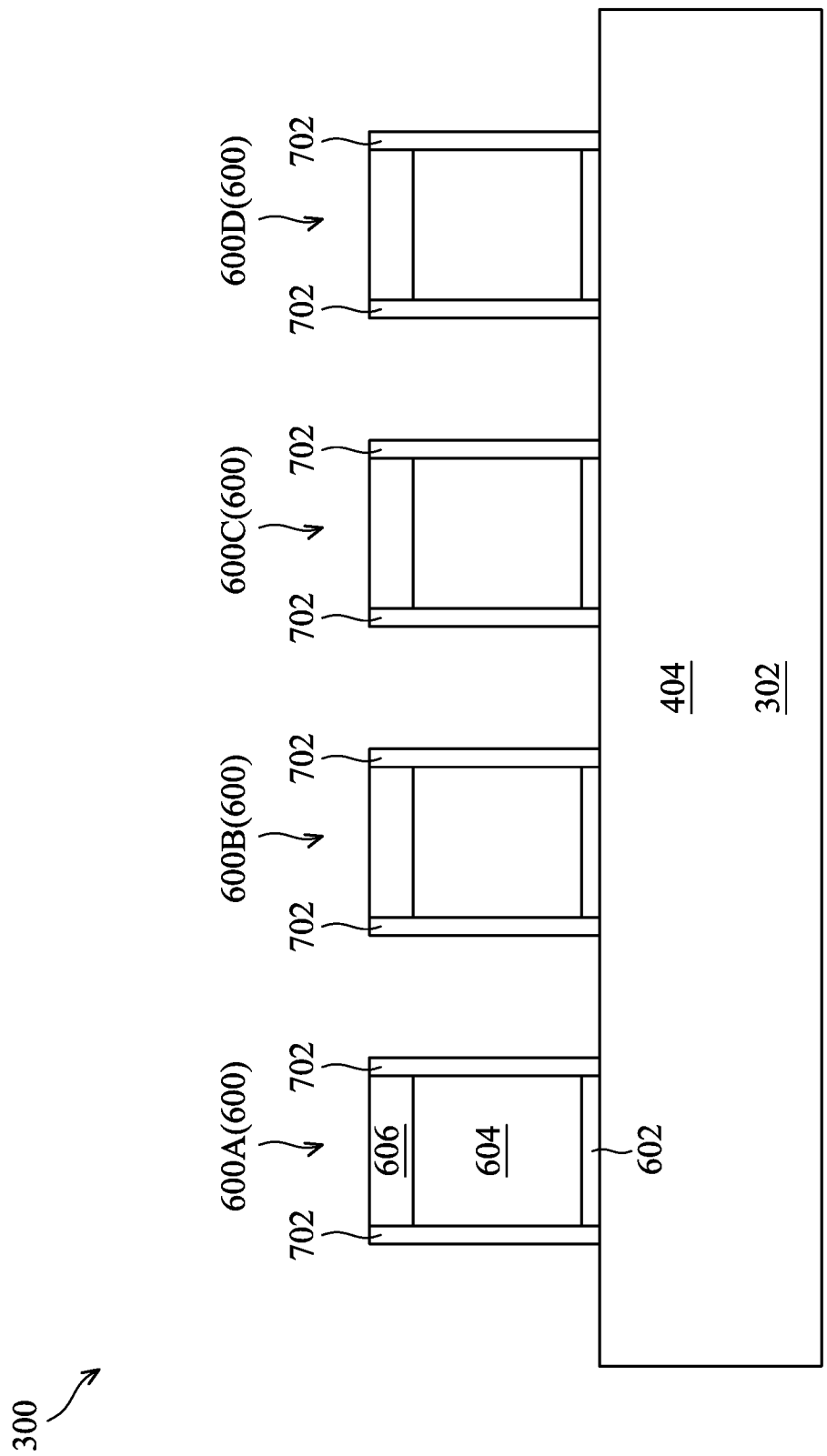

Corresponding to operation 210 of FIG. 2, FIG. 7 is a cross-sectional view of the FinFET device 300 including a number of gate spacers 702 formed in the fin 404 at one of the various stages of fabrication. The cross-sectional view of FIG. 7 is cut along the lengthwise direction of the fin 404 (e.g., cross-section A-A, as shown in FIG. 1).

The gate spacer 702 can be formed on opposing sidewalls of each of the dummy gate structures 600A-D. The gate spacer 702 may be a low-k spacer and may be formed of a suitable dielectric material, such as silicon oxide, silicon oxycarbonitride, silicon nitride, silicon oxynitride, silicon carbonitride, the like, or combinations thereof. Any suitable deposition method, such as thermal oxidation, chemical vapor deposition (CVD), or the like, may be used to form the gate spacer 702. The shapes and formation methods of the gate spacer 702 as illustrated in FIG. 7 (and the following figures) are merely non-limiting examples, and other shapes and formation methods are possible. These and other variations are fully intended to be included within the scope of the present disclosure.

Figure 8:
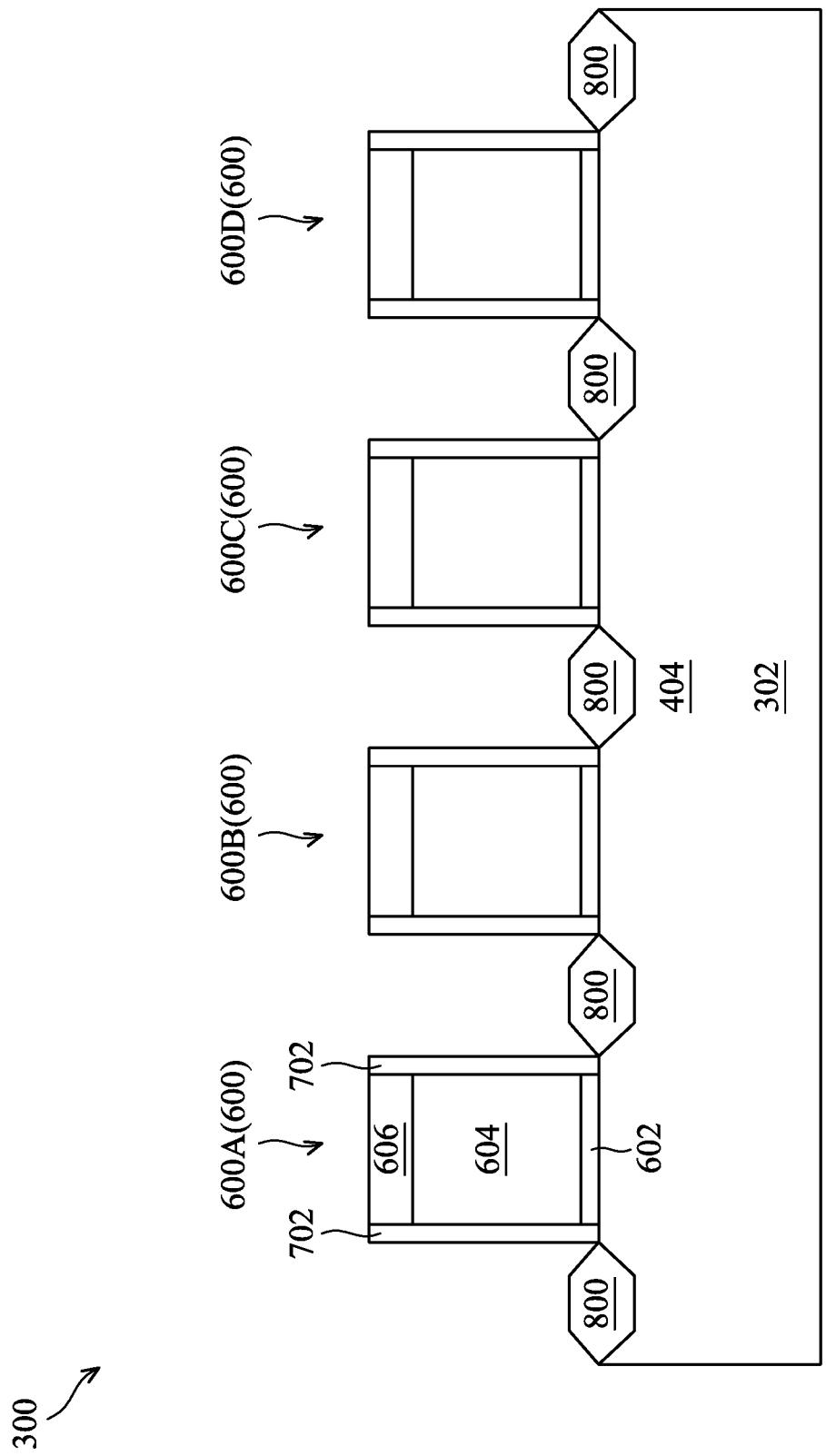

Corresponding to operation 212 of FIG. 2, FIG. 8 is a cross-sectional view of the FinFET device 300 including a number of source/drain structures 800 at one of the various stages of fabrication. The cross-sectional view of FIG. 8 is cut along the lengthwise direction of the fin 404 (e.g., cross-section A-A, as shown in FIG. 1).

The source/drain structures 800 are formed in recesses of the fin 404 adjacent to each of the dummy gate structures 600, e.g., between adjacent dummy gate structures 600 and/or next to a dummy gate structure 600. The recesses are formed by, e.g., an anisotropic etching process using the dummy gate structures 600 as an etching mask, in some embodiments, although any other suitable etching process may also be used. Next, the source/drain structures 800 are formed by epitaxially growing a semiconductor material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 8, the epitaxial source/drain structures 800 may have surfaces raised from respective surfaces of the fin 404 (e.g. raised above the non-recessed portions of the fin 404) and may have facets. In some embodiments, the source/drain structures 800 of the adjacent fins may merge to form a continuous epitaxial source/drain structure (not shown). In some embodiments, the source/drain structures 800 of the adjacent fins may not merge together and remain separate source/drain structures 800 (not shown). In some embodiments, when the resulting FinFET device is an n-type FinFET, the source/drain structures 800 can include silicon carbide (SiC), silicon phosphorous (SiP), phosphorous-doped silicon carbon (SiCP), or the like. In some embodiments, when the resulting FinFET device is a p-type FinFET, the source/drain structures 800 comprise SiGe, and a p-type impurity such as boron or indium.

The epitaxial source/drain structures 800 may be implanted with dopants to form source/drain structures 800 followed by an annealing process. The implanting process may include forming and patterning masks such as a photoresist to cover the regions of the FinFET device 300 that are to be protected from the implanting process. The source/drain structures 800 may have an impurity (e.g., dopant) concentration in a range from about $1 \times 10^{19}$ cm$^{-3}$ to about $1 \times 10^{21}$ cm$^{-3}$. P-type impurities, such as boron or indium, may be implanted in the source/drain structure 800 of a P-type transistor. N-type impurities, such as phosphorous or arsenide, may be implanted in the source/drain structures 800 of an N-type transistor. In some embodiments, the epitaxial source/drain structures 800 may be in situ doped during their growth.

Figure 9:
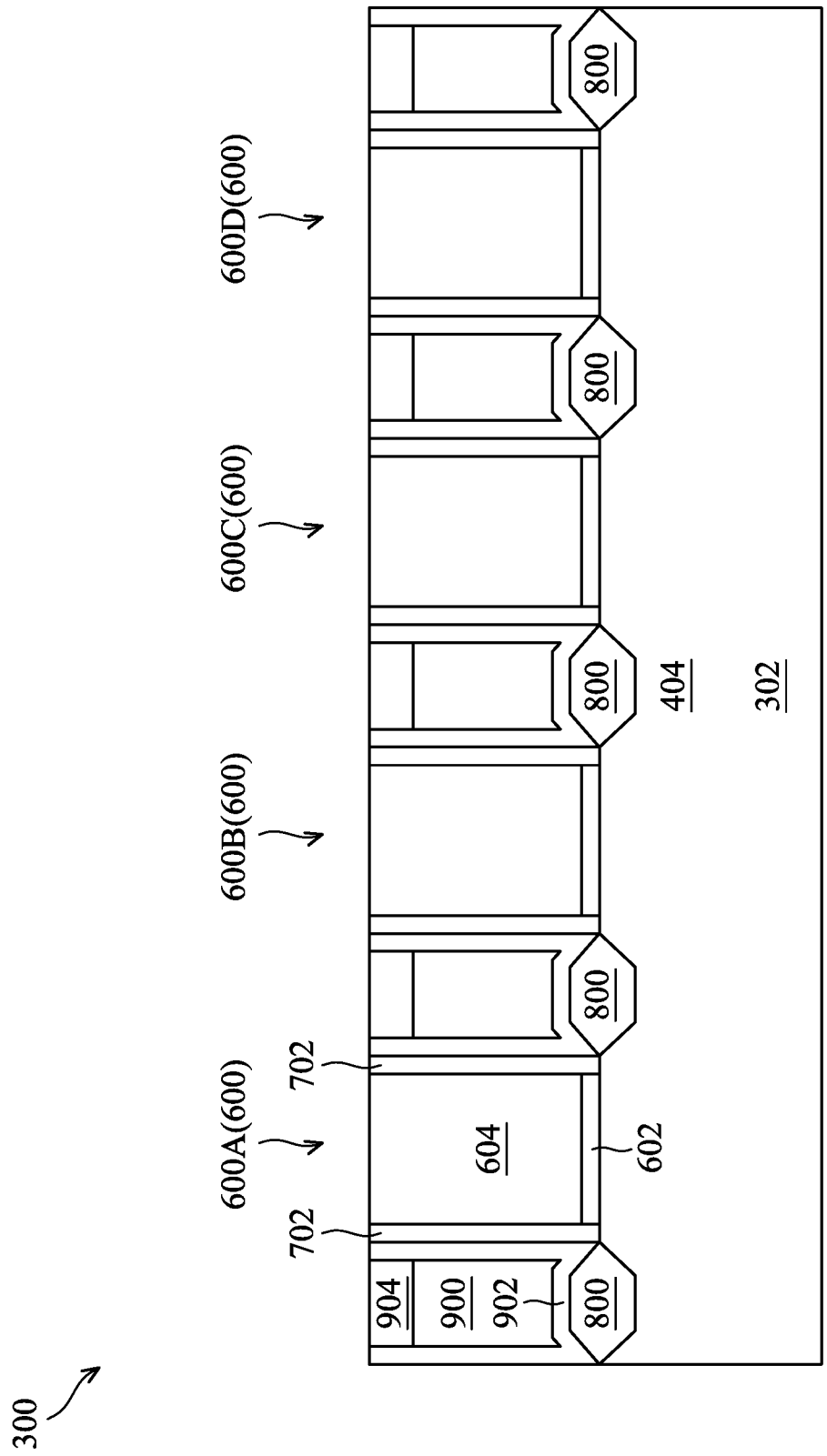

Corresponding to operation 214 of FIG. 2, FIG. 9 is a cross-sectional view of the FinFET device 300 including an interlayer dielectric (ILD) 900 at one of the various stages of fabrication. The cross-sectional view of FIG. 9 is cut along the lengthwise direction of the fin 404 (e.g., cross-section A-A, as shown in FIG. 1).

In some embodiments, prior to forming the ILD 900, a contact etch stop layer (CESL) 902 is formed over the structure illustrated in FIG. 9. The CESL 902 can function as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

Next, the ILD 900 is formed over the CESL 902 and over the dummy gate structures 600 (e.g., 600A, 600B, 600C, and 600D). In some embodiments, the ILD 900 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD 900 is formed, a dielectric layer 904 is optionally formed over the ILD 900. The dielectric layer 904 can function as a protection layer to prevent or reduces the loss of the ILD 900 in subsequent etching processes. The dielectric layer 904 may be formed of a suitable material, such as silicon nitride, silicon carbonitride, or the like, using a suitable method such as CVD, PECVD, or FCVD. After the dielectric layer 904 is formed, a planarization process, such as a CMP process, may be performed to achieve a level upper surface for the dielectric layer 904. The CMP may also remove the mask 606 and portions of the CESL 902 disposed over the dummy gate 604. After the planarization process, the upper surface of the dielectric layer 904 (if any) or the upper surface of the ILD 900 is level with the upper surface of the dummy gate 604, in some embodiments.

An example gate-last process (sometimes referred to as replacement gate process) is performed subsequently to replace the dummy gate 604 and the dummy gate dielectric 602 of each of the dummy gate structures 600 with an active gate structure (which may also be referred to as a replacement gate structure or a metal gate structure).

Figure 10:
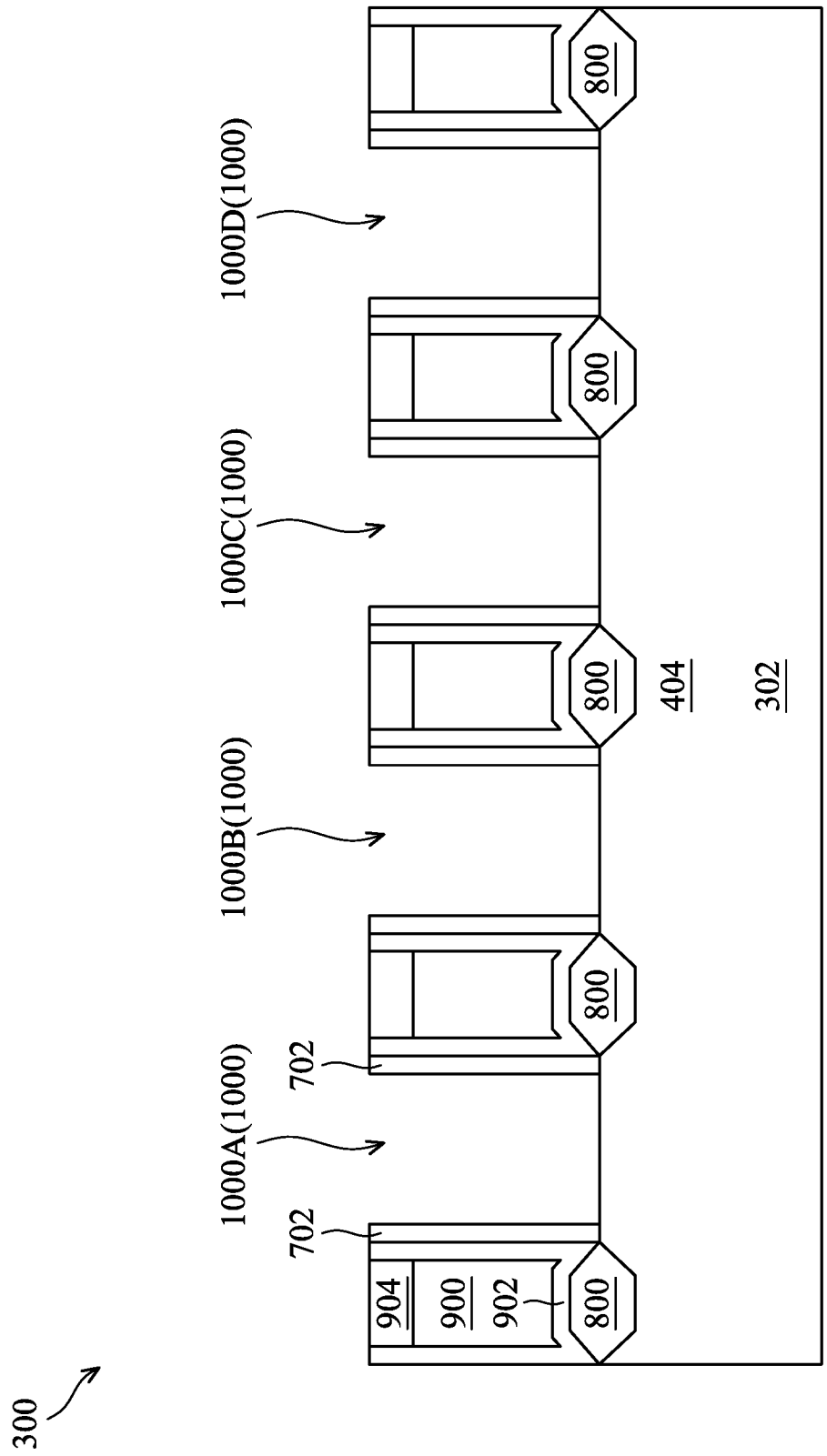

Corresponding to operation 216 of FIG. 2, FIG. 10 is a cross-sectional view of the FinFET device 300 in which the dummy gate structures 600A, 600B, 600C, and 600D (FIG. 9) are removed to form gate trenches 1000A, 1000B, 1000C, and 1000D, respectively, at one of the various stages of fabrication. The cross-sectional view of FIG. 10 is cut along the lengthwise direction of the fin 404 (e.g., cross-section A-A, as shown in FIG. 1). The gate trenches 1000A-D may sometimes be collectively referred to as gate trenches 1000.

To remove the dummy gate structures 600, one or more etching steps are performed to remove the dummy gate 604 and the dummy gate dielectric 602 directly under the dummy gate 604, so that the gate trenches 1000 (which may also be referred to as recesses) are formed between respective first gate spacers 702. Each gate trench 1000 exposes the channel region of the fin 404. During the dummy gate removal, the dummy gate dielectric 602 may be used as an etch stop layer when the dummy gate 604 is etched. The dummy gate dielectric 602 may then be removed after the removal of the dummy gate 604.

Next, an anisotropic etching process, such as a dry etch process, is performed to remove upper portions of the first gate spacer 702. In some embodiments, the anisotropic etching process is performed using an etchant that is selective to (e.g., having a higher etching rate for) the material of the first gate spacer 702, such that the first gate spacer 702 is recessed (e.g., upper portions removed) without substantially attacking the second gate spacer (not shown) and the dielectric layer 904. After the upper portions of the first gate spacers 702 are removed, upper sidewalls of the second gate spacer are exposed.

Figure 11:
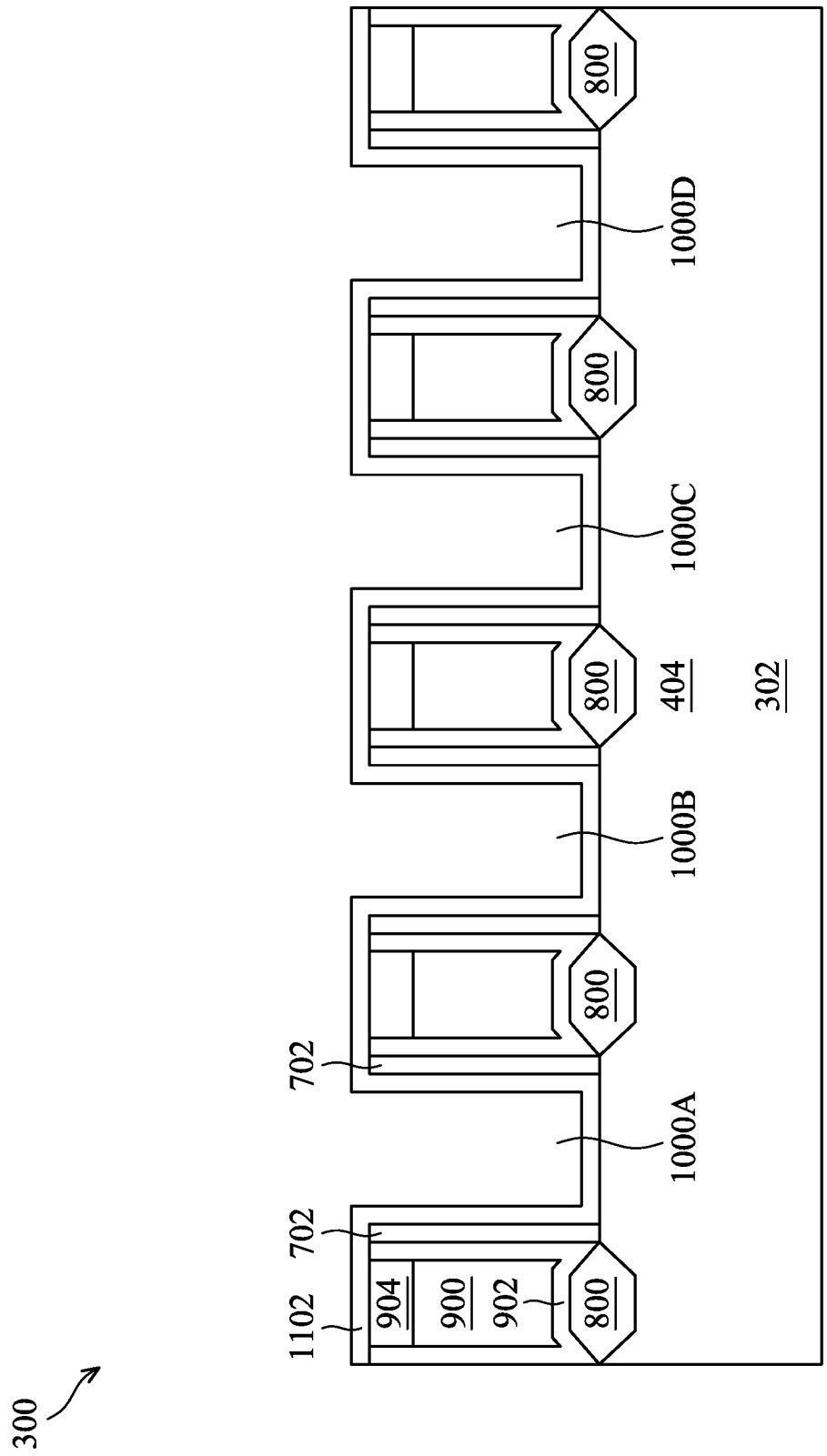

Corresponding to operation 218 of FIG. 2, FIG. 11 is a cross-sectional view of the FinFET device 300 including a gate dielectric layer 1102 at one of the various stages of fabrication. The cross-sectional view of FIG. 11 is cut along the lengthwise direction of the fin 404 (e.g., cross-section A-A, as shown in FIG. 1).

The gate dielectric layer 1102 is formed (e.g., deposited) conformally over the gate trenches 1000A-D, such as on the top surfaces and the sidewalls of the fin 404, on the top surfaces and the sidewalls of the gate spacers 702, and on the top surface of the dielectric layer 904 (if any). In accordance with some embodiments, the gate dielectric layer 1102 includes silicon oxide, silicon nitride, or multilayers thereof. In example embodiments, the gate dielectric layer 1102 includes a high-k dielectric material, and in these embodiments, the gate dielectric layers 1102 may have a k value greater than about 7.0, and may include a metal oxide or a silicate of Hf, Al, Zr, La, Mg, Ba, Ti, Pb, and combinations thereof. The formation methods of gate dielectric layer 1102 may include molecular beam deposition (MBD), atomic layer deposition (ALD), PECVD, and the like. A thickness of the gate dielectric layer 1102 may be between about 8 angstroms (Å) and about 20 angstroms, as an example. A thickness of the gate dielectric layer 1102 may be between about 5 nanometer (nm) and about 25 nm, as another example.

Figure 12:
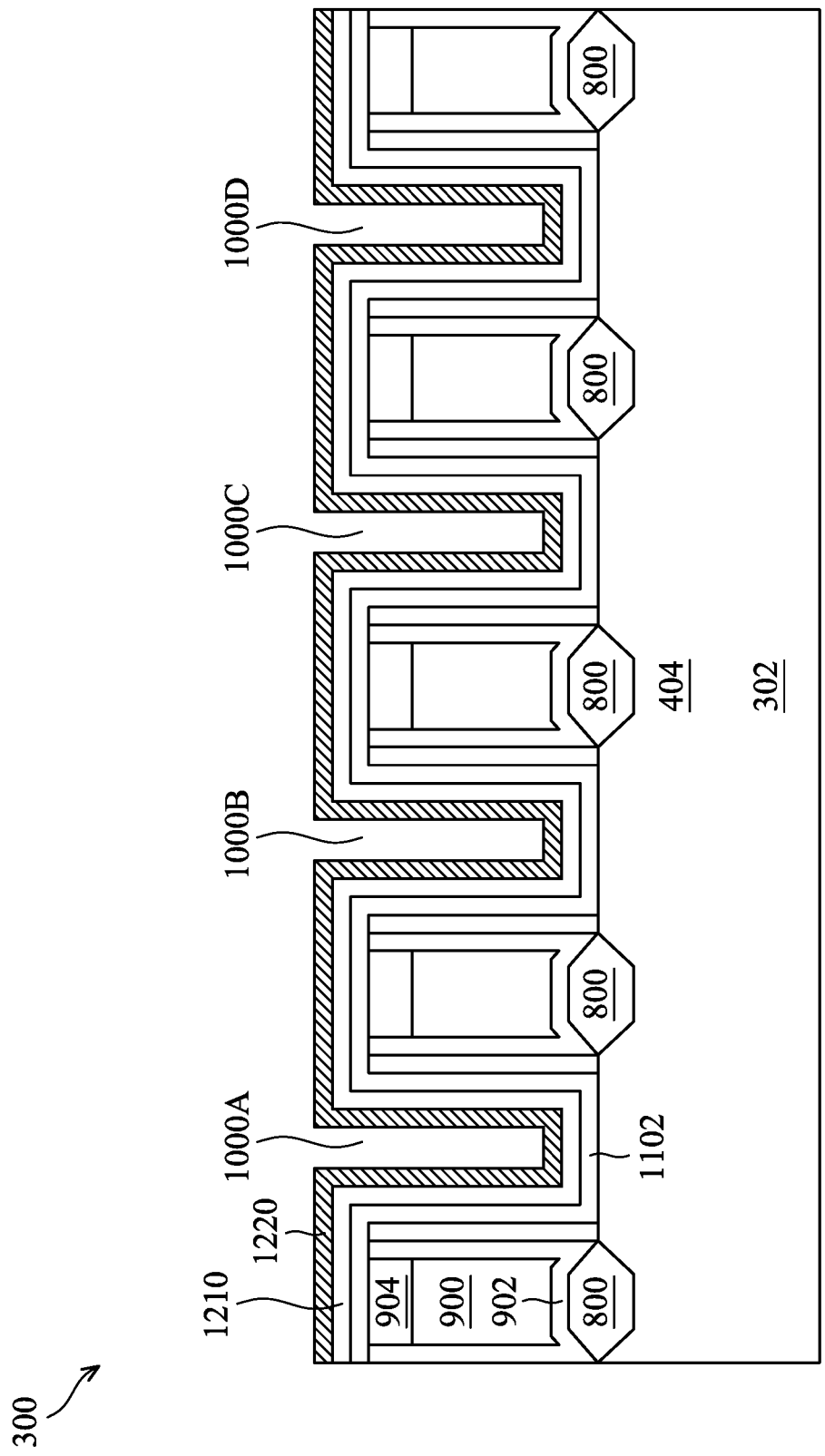

Corresponding to operation 220 of FIG. 2, FIG. 12 is a cross-sectional view of the FinFET device 300 including a first work function layer 1210 and a second work function layer 1220 at one of the various stages of fabrication. The cross-sectional view of FIG. 12 is cut along the lengthwise direction of the fin 404 (e.g., cross-section A-A, as shown in FIG. 1).

The first work function layer 1210 is deposited (e.g., conformally) over the gate dielectric layer 1102, and the second work function layer 1220 is deposited (e.g., conformally) over the first work function layer 1210. The first and second work function layers 1210 and 1220 may each be a P-type work function layer, an N-type work function layer, multi-layers thereof, or combinations thereof. In the discussion herein, a work function layer may also be referred to as a work function metal. Example P-type work function metals include TiN, TaN, Ru, Mo, Al, WN, $ZrSi_2$, $MoSi_2$, $TaSi_2$, $NiSi_2$, WCN, other suitable P-type work function materials, or combinations thereof. Example N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof. The work function layer(s) may be deposited by CVD, physical vapor deposition (PVD), ALD, and/or other suitable process. A thickness of a P-type work function layer may be between about 8 Å and about 15 Å, and a thickness of an N-type work function layer may be between about 15 Å and about 30 Å, as an example. A thickness of a P-type work function layer may be between about 5 nanometer (nm) and about 25 nm, and a thickness of an N-type work function layer may be between about 5 nm and about 25 nm, as another example.

In accordance with various embodiments of the present disclosure, the first work function layer 1210 includes TiN and the second work function layer 1220 includes WCN. A work function value is associated with the material composition of the work function layer, and thus, the material of the work function layer is chosen to tune its work function value so that a target threshold voltage $V_t$ is achieved in the device that is to be formed. By tuning the concentration of tungsten (W) from the second work function layer 1220 remaining in the first work function layer 1210 over the gate trenches 1000A-D, a number of active gate structures that have respective different threshold voltage can be formed, which will be discussed in further detail below.

Figure 13:
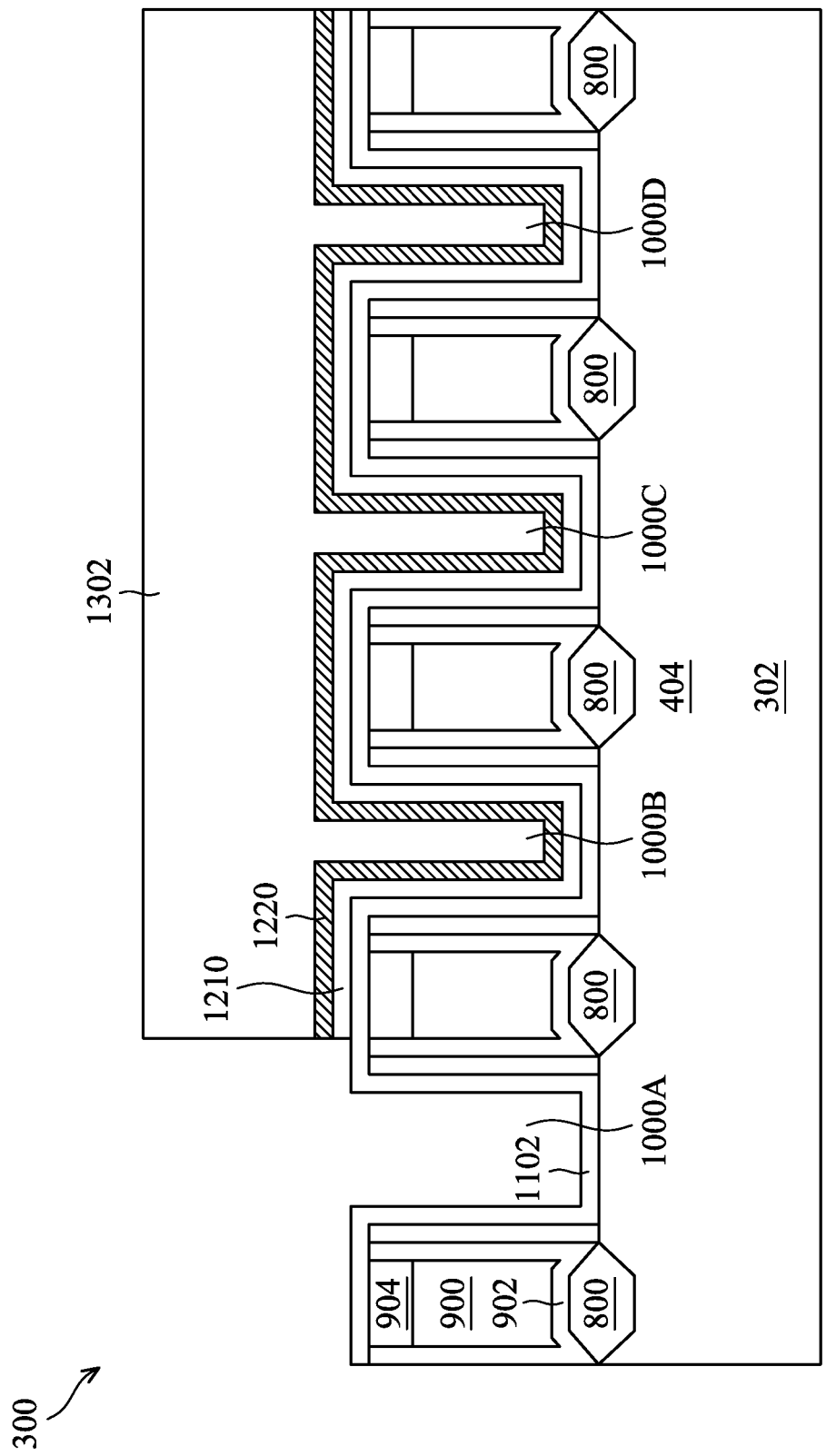
Figure 14:
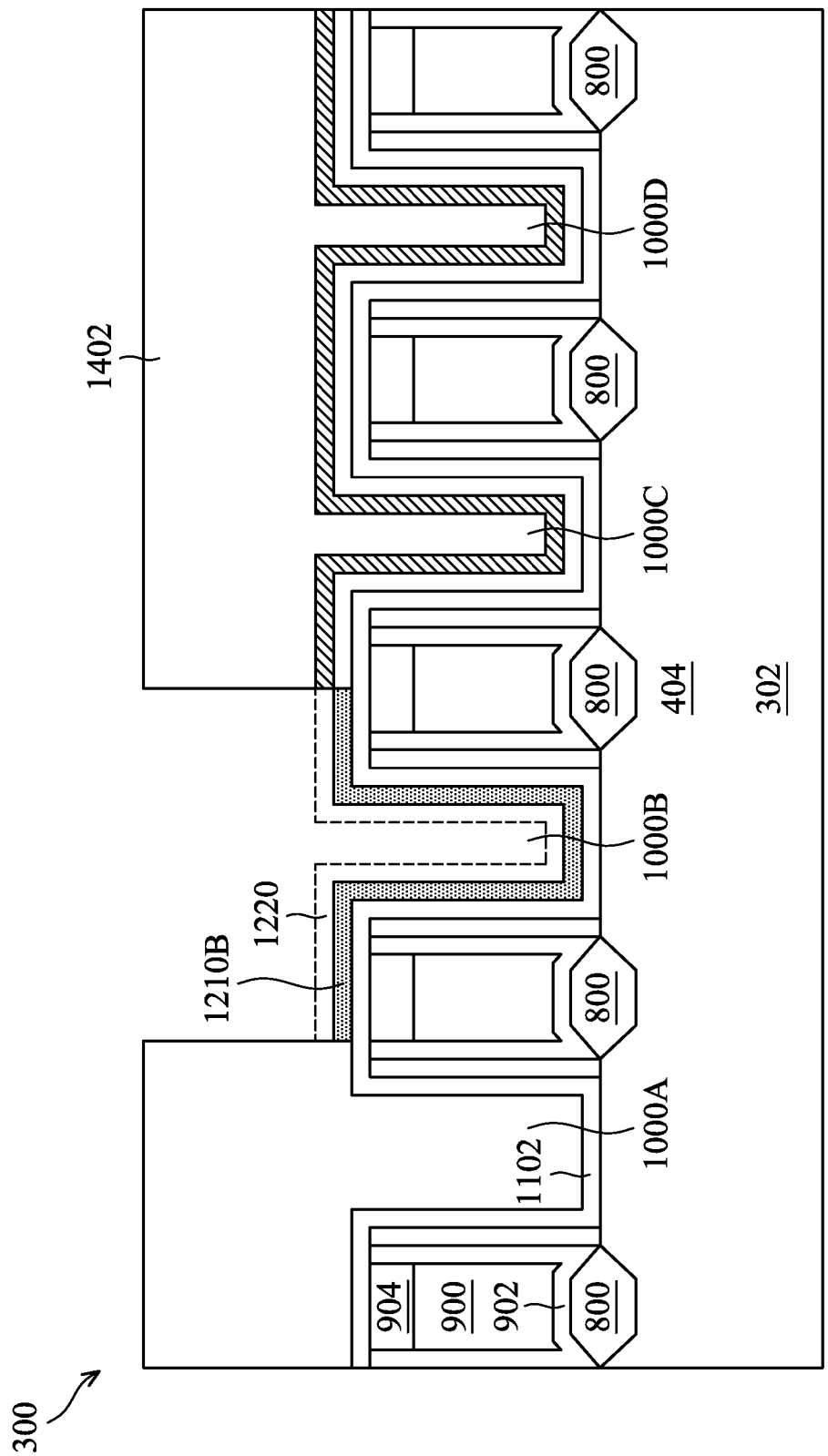
Figure 15:
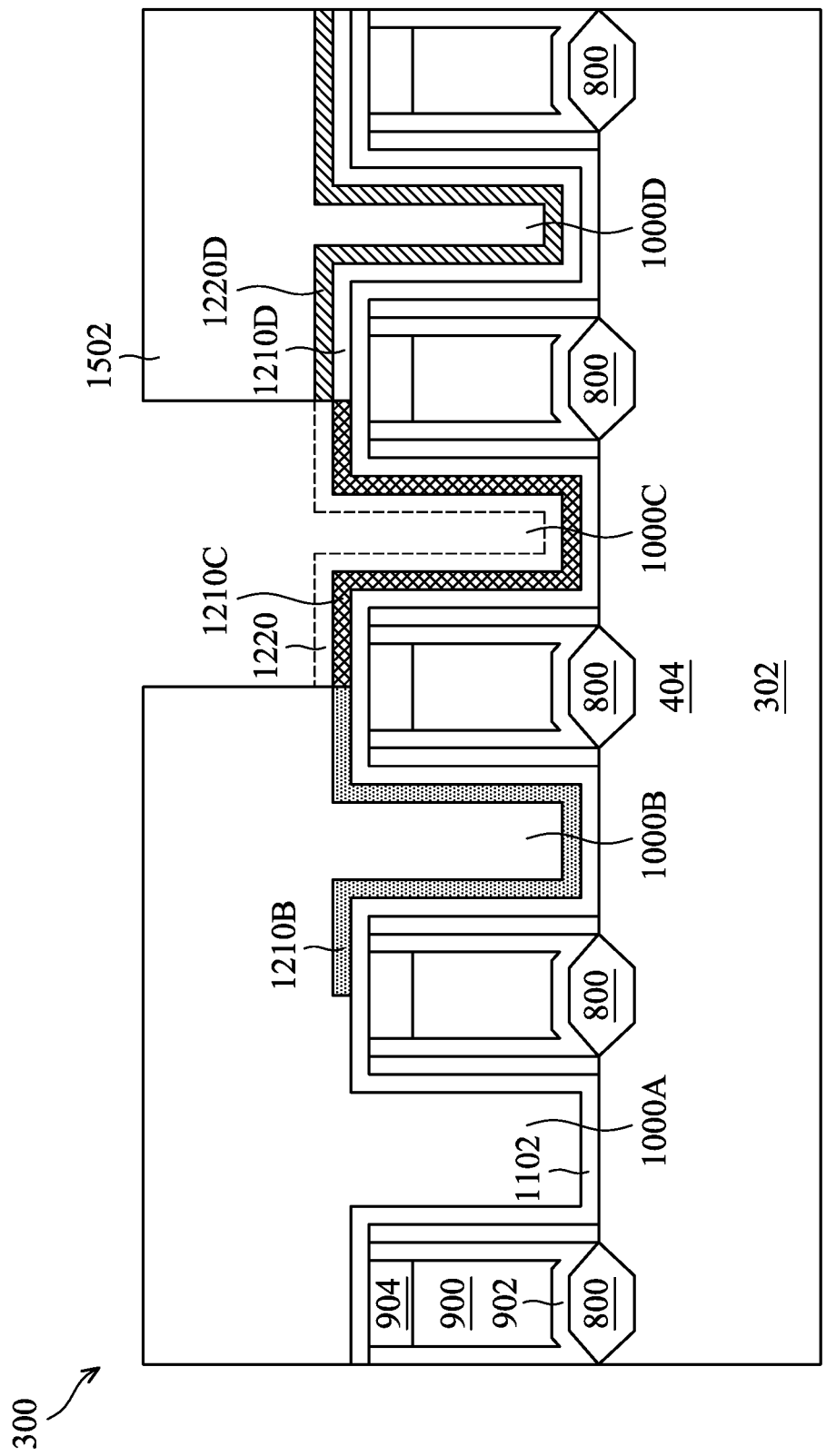

Corresponding to operation 222 of FIG. 2, FIG. 13-15 are each a cross-sectional view of the FinFET device 300 including a different combination of the first work function layer 1210 and/or the second work function layer 1220 at one of the various stages of fabrication. The cross-sectional views of FIG. 13-15 are each cut along the lengthwise direction of the fin 404 (e.g., cross-section A-A, as shown in FIG. 1).

In some embodiments, operation 222 may be repeated performed until a desired number of different combinations of the first and/or second work function layers is reached. In the example where the first and second work function layers are formed over N gate trenches, operation 222 may be repeated performed (N−1) times to reach N different combinations of the first and/or second work function layers. In the example to be discussed below, the first and second work function layers are formed over 4 gate trenches. A first one of the gate trenches is overlaid by neither the first work function layer nor the second work function layer (through a first operation 222); a second one the gate trenches is overlaid by no second work function layer, but by the first work function layer with a first doping concentration of W left from the second work function layer (through a second operation 222); a third one the gate trenches is overlaid by no second work function layer, but by the first work function layer with a second doping concentration of W left from the second work function layer (through a third operation 222); and a fourth one the gate trenches is overlaid by both the first work function layer and the second work function layer. As such, four different combinations of work function layers are reached by performing operation 222 three times. Although one of the gate trenches is overlaid by neither the first work function layer nor the second work function layer, it should understood that the first work function layer is not necessarily to be removed, while remaining within the scope of the present disclosure.

Referring first to FIG. 13, a first mask layer (e.g., a photoresist layer) 1302 is formed over the gate trenches 1000A-D, with the gate trench 1000A exposed. Upon forming the first mask layer 1302, the first work function layer 1210 and the second work function layer 1220 over the gate trench 1000A are removed. The first work function layer 1210 and the second work function layer 1220 over the gate trench 1000A may be removed applying a wet etching solution over the workpiece (e.g., with only the first work function layer 1210 and the second work function layer 1220 over the gate trench 1000A exposed to the wet etching solution) using a first etching condition. The wet etching solution includes a solution selected from the group consisting of: water containing ozone (sometimes referred to as $O_3$ water), water containing carbon dioxide (sometimes referred to as $CO_2$ water), an acid (e.g., hydrochloric acid) with an oxidizer (e.g., hydrogen peroxide), or combinations thereof. The first etching condition includes a higher end of a range of the concentration/quantity of the wet etching solution (e.g., about 1~50 ppm of the $O_3$ water, or about 0.1~12 M of the hydrochloric acid), and a higher end of the reaction temperature (e.g., about 20~80° C.). After removing the first work function layer 1210 and the second work function layer 1220 over the gate trench 1000A, the mask layer 1302 is removed.

Referring next to FIG. 14, a second mask layer (e.g., a photoresist layer) 1402 is formed over the gate trenches 1000A-D, with the gate trench 1000B exposed. Upon forming the second mask layer 1402, the second work function layer 1220 over the gate trench 1000B is removed. The second work function layer 1220 over the gate trench 1000B may be removed applying a wet etching solution over the workpiece (e.g., with only the first work function layer 1210 and the second work function layer 1220 over the gate trench 1000B exposed to the wet etching solution) using a second etching condition. The wet etching solution includes a solution selected from the group consisting of: water containing ozone (sometimes referred to as $O_3$ water), water containing carbon dioxide (sometimes referred to as $CO_2$ water), an acid (e.g., hydrochloric acid) without an oxidizer that includes hydrogen peroxide, or combinations thereof. The second etching condition includes a middle end of a range of the concentration/quantity of the wet etching solution (e.g., about 1~50 ppm of the $O_3$ water, or about 0.1~12 M of the hydrochloric acid), and a middle end of the reaction temperature (e.g., about 20~80° C.). As such, the first work function layer 1210 over the gate trench 1000B may present a first concentration of W dopants that remain from the removed second work function layer 1220 (shown in dotted lines in FIG. 14). Hereinafter, the first work function layer 1210 (over the gate trench 1000B) is referred to as "first work function layer 1210B." After forming the first work function layer 1210B, the mask layer 1402 is removed.

Referring next to FIG. 15, a third mask layer (e.g., a photoresist layer) 1502 is formed over the gate trenches 1000A-D, with the gate trench 1000C exposed. Upon forming the second mask layer 1502, the second work function layer 1220 over the gate trench 1000C is removed. The second work function layer 1220 over the gate trench 1000C may be removed applying a wet etching solution over the workpiece (e.g., with only the first work function layer 1210 and the second work function layer 1220 over the gate trench 1000C exposed to the wet etching solution) using a third etching condition. The wet etching solution includes a solution selected from the group consisting of: water containing ozone (sometimes referred to as $O_3$ water), water containing carbon dioxide (sometimes referred to as $CO_2$ water), an acid (e.g., hydrochloric acid) without an oxidizer that includes hydrogen peroxide, or combinations thereof. The third etching condition includes a lower end of a range of the concentration/quantity of the wet etching solution (e.g., about 1~50 ppm of the $O_3$ water, or about 0.1~12 M of the hydrochloric acid), and a lower end of the reaction temperature (e.g., about 20~80° C.). As such, the first work function layer 1210 over the gate trench 1000B may present a second concentration of W dopants that remain from the removed second work function layer 1220 (shown in dotted lines in FIG. 15). Hereinafter, the first work function layer 1210 (over the gate trench 1000C) is referred to as "first work function layer 1210C." After forming the first work function layer 1210C, the mask layer 1502 is removed.

In some embodiments, the first concentration of W dopants of the first work function layer 1210B is lower than the second concentration of W dopants of the second work function layer 1210C, e.g., by about 3%. Consequently, the gate trenches 1000A-D may be overlaid by different combinations of the first and/or second work function layers. For example, the gate trench 1000A is overlaid by neither the first work function layer 1210 nor the second work function layer 1220; the gate trench 1000B is overlaid by the first work function layer 1210B with the first doping concentration of W; the gate trench 1000C is overlaid by the first work function layer 1210C with the second doping concentration of W; and the gate trench 1000D is overlaid by both the first work function layer 1210 and the second work function layer 1220 (hereinafter "first work function layer 1210D" and "second work function layer 1220D," respectively).

Figure 16:
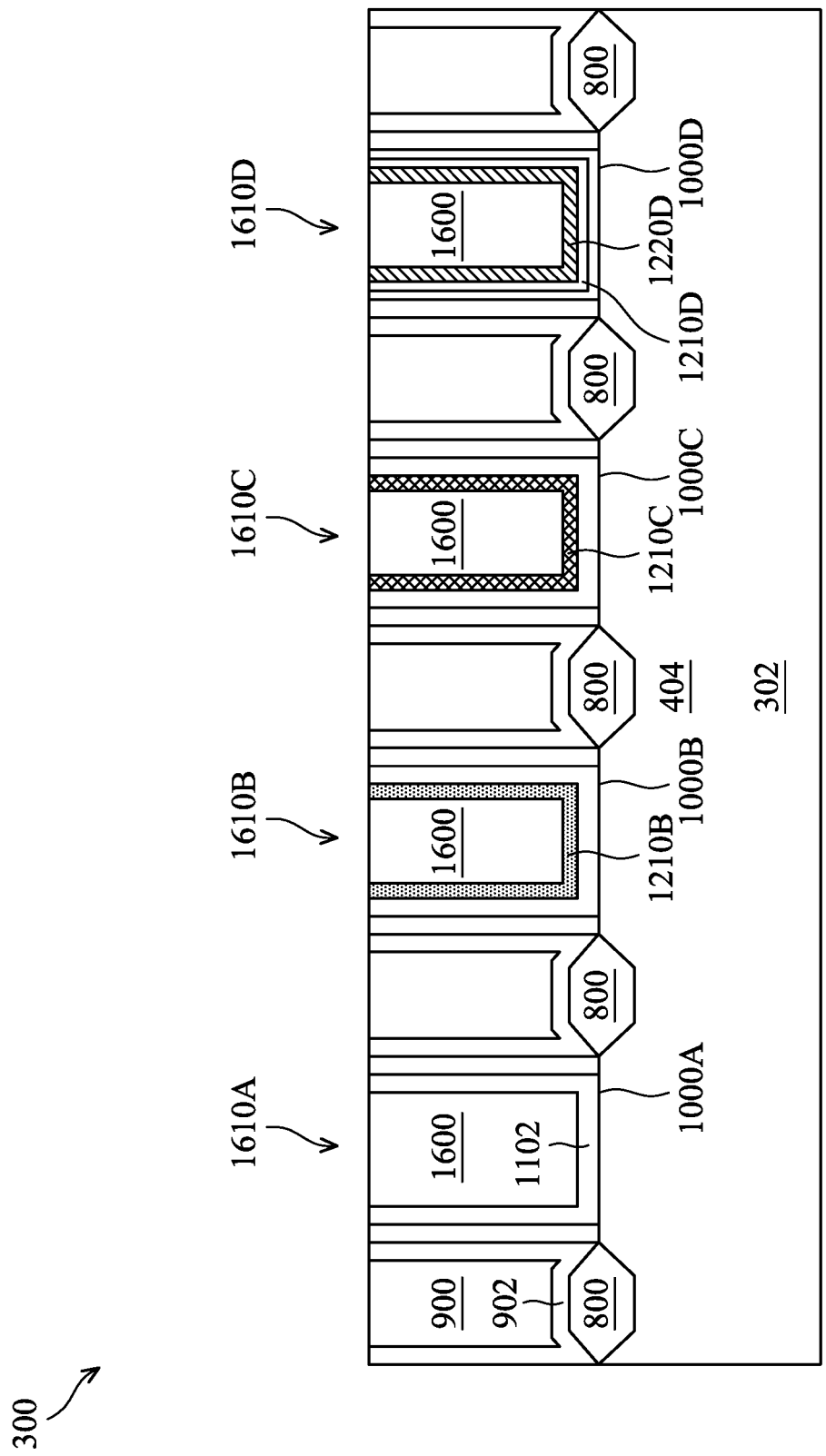

Corresponding to operation 224 of FIG. 2, FIG. 16 is a cross-sectional view of the FinFET device 300 including a number of active gate structures 1610A, 1610B, 1610C, and 1610D at one of the various stages of fabrication. The cross-sectional view of FIG. 16 is cut along the lengthwise direction of the fin 404 (e.g., cross-section A-A, as shown in FIG. 1).

As shown, the active gate structure 1610A includes a metal fill 1600 filling the gate trench 1000A, with the gate dielectric layer 1102 disposed therebetween; the active gate structure 1610B includes the metal fill 1600 filling the gate trench 1000B, with the gate dielectric layer 1102 and the first work function layer 1210B disposed therebetween; the active gate structure 1610C includes the metal fill 1600 filling the gate trench 1000C, with the gate dielectric layer 1102 and the first work function layer 1210C disposed therebetween; and the active gate structure 1610D includes the metal fill 1600 filling the gate trench 1000D, with the gate dielectric layer 1102 and the first and second work function layers 1210D and 1220D disposed therebetween. The metal fill 1600 may include a suitable metal, such as tungsten (W), formed by a suitable method, such as PVD, CVD, electroplating, electroless plating, or the like. Besides tungsten, other suitable material, such as copper (Cu), gold (Au), cobalt (Co), combinations thereof, multi-layers thereof, alloys thereof, or the like, may also be used as the metal fill 1600.

As a result, the active gate structures 1610A-D may correspond to respective different threshold voltages. For example, the active gate structure 1610A may correspond to a more N-type threshold voltage (e.g., having an effective work function of about 4.0~4.25 eV), as the active gate structure 1610A includes no P-type work function layer (e.g., TiN); the active gate structure 1610B may correspond to a mixture of N-type and P-type threshold voltages (e.g., having an effective work function of about 4.25~4.5 eV), as the active gate structure 1610B includes a relatively lightly doped P-type work function layer 1210B; the active gate structure 1610C may correspond to a mixture of N-type and P-type threshold voltages (e.g., having an effective work function of about 4.5~4.75 eV), as the active gate structure 1610C includes a relatively highly doped P-type work function layer 1210C; and the active gate structure 1610D may correspond to a more P-type threshold voltage (e.g., having an effective work function of about 4.7~5.0 eV), as the active gate structure 1610D includes the work function layers 1210D and 1220D.

In one aspect of the present disclosure, a method for manufacturing a semiconductor device is disclosed. The method includes forming a first gate trench and a second gate trench over a semiconductor fin. The method includes depositing a first work function layer over the first and second gate trenches. The method includes depositing a second work function layer over the first work function layer. The method includes etching the second work function layer in the first gate trench while covering the second work function layer in the second gate trench, thereby causing the first work function layer in the first gate trench to contain metal dopants that are left from the second work function layer etched in the first gate trench. The method includes forming a first active gate structure and a second active gate structure in the first gate trench and the second gate trench, respectively. The first active gate structure comprises the first work function layer and the metal dopants that are left from the second work function layer in the first gate trench, and the second active gate structure comprises the first work function layer and no metal dopants left behind from the second work function layer.

In another aspect of the present disclosure, a method for manufacturing a semiconductor device is disclosed. The method includes forming a number (N) of gate trenches over a semiconductor fin, wherein N is equal to or greater than 3. The method includes depositing a first work function layer over the N gate trenches. The method includes depositing a second work function layer over the first work function layer. The method includes etching the second work function layer in a first one of the N gate trenches, while covering the second work function layer in remaining gate trenches, thereby causing the first work function layer in the first gate trench to contain metal dopants that are left from the second work function layer in the first gate trench. The method includes etching the second work function layer in a next one of the N gate trenches, while covering the second work function layer in remaining gate trenches, thereby causing the first work function layer in the next gate trench to contain metal dopants that are left from the second work function layer in the next gate trench. A first concentration of the metal dopants in the first work function layer in the first gate trench is different from a second concentration of the metal dopants in the second work function layer in the second gate trench.

In yet another aspect of the present disclosure, a semiconductor device is disclosed. The semiconductor device includes a semiconductor fin. The semiconductor device includes a plurality of active gate structures. Each of the plurality of active gate structures straddles a respective portion of the semiconductor fin. Each of the plurality of active gate structures comprises a work function layer doped with a respective concentration of tungsten (W).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
   forming a plurality of gate trenches over a semiconductor fin;
   depositing a first work function layer over the plurality of gate trenches;
   depositing a second work function layer over the first work function layer;
   performing a first etching process on the second work function layer in a first one of the gate trenches, with a first etching condition, while covering the second work function layers in other ones of the gate trenches; and
   performing a second etching process on the second work function layer in a second one of the gate trenches, with a second etching condition, while covering the second work function layers in other ones of the gate trenches; and
   forming a first active gate structure and a second active gate structure in the first gate trench and the second gate trench, respectively, wherein the first active gate structure comprises the first work function layer and metal dopants, with a first dopant concentration, that are left from the second work function layer in the first gate trench, and the second active gate structure comprises the first work function layer and the metal dopants, with a second dopant concentration, that are left behind from the second work function layer,
   wherein the first etching condition is different from the second etching condition.

2. The method of claim 1, wherein the first etching process and the second etching process each include applying a wet etching solution over the second work function layer.

3. The method of claim 2, wherein the wet etching solution comprises a solution selected from the group consisting of: water containing ozone, water containing carbon dioxide, an acid with no hydrogen peroxide, and combinations thereof.

4. The method of claim 3, wherein the first etching condition includes a first concentration of the wet etching solution, and the second etching condition includes a second concentration of the wet etching solution.

5. The method of claim 4, wherein the first concentration is lower than the second concentration.

6. The method of claim 5, wherein the first work function layer in the first gate trench contains metal dopants, with a first dopant concentration, that are left from the second work function layer etched in the first gate trench, and the first work function layer in the second gate trench contains the metal dopants, with a second dopant concentration, that are left from the second work function layer etched in the second gate trench, and wherein the first dopant concentration is lower than the second dopant concentration.

7. The method of claim 6, wherein the first work function layer includes titanium nitride (TiN), and the second work function layer incudes tungsten carbide nitride (WCN).

8. The method of claim 7, wherein the metal dopants include tungsten (W).

9. The method of claim 1, wherein the first dopant concentration is different from the second dopant concentration.

10. A method for manufacturing a semiconductor device, comprising:
- forming a plurality of gate trenches over a semiconductor fin;
- depositing a first work function layer over the plurality of gate trenches;
- depositing a second work function layer over the first work function layer;
- performing a first etching process on the second work function layer in a first one of the gate trenches, with a first etching condition, while covering the second work function layers in other ones of the gate trenches; and
- performing a second etching process on the second work function layer in a second one of the gate trenches, with a second etching condition, while covering the second work function layers in other ones of the gate trenches;
- wherein the first etching condition is different from the second etching condition, causing the first work function layer in the first gate trench to contain metal dopants, with a first dopant concentration, that are left from the second work function layer etched in the first gate trench, and the first work function layer in the second gate trench to contain the metal dopants, with a second dopant concentration, that are left from the second work function layer etched in the second gate trench; and
- wherein the first dopant concentration is different from the second dopant concentration.

11. The method of claim 10, wherein the first etching process and the second etching process each include applying a wet etching solution over the second work function layer.

12. The method of claim 11, wherein the wet etching solution comprises a solution selected from the group consisting of: water containing ozone, water containing carbon dioxide, an acid with no hydrogen peroxide, and combinations thereof.

13. The method of claim 12, wherein the first etching condition includes a first concentration of the wet etching solution, and the second etching condition includes a second concentration of the wet etching solution, and wherein the first concentration is lower than the second concentration.

14. The method of claim 10, wherein the first work function layer includes titanium nitride (TiN), and the second work function layer incudes tungsten carbide nitride (WCN).

15. The method of claim 14, wherein the metal dopants include tungsten (W).

16. The method of claim 10, further comprising:
- forming a first active gate structure and a second active gate structure in the first gate trench and the second gate trench, respectively, wherein the first active gate structure comprises the first work function layer and the metal dopants, with the first dopant concentration, that are left from the second work function layer in the first gate trench, and the second active gate structure comprises the first work function layer and the metal dopants, with the second dopant concentration, that are left behind from the second work function layer.

17. The method of claim 16, wherein the first and second active gate structures correspond to respective different threshold voltages.

18. A method for manufacturing a semiconductor device, comprising:
- forming a plurality of gate trenches over a semiconductor fin;
- depositing a first work function layer over the plurality of gate trenches;
- depositing a second work function layer over the first work function layer;
- performing a first etching process on the second work function layer in a first one of the gate trenches, with a first etching condition, while covering the second work function layers in other ones of the gate trenches;
- performing a second etching process on the second work function layer in a second one of the gate trenches, with a second etching condition, while covering the second work function layers in other ones of the gate trenches;
- wherein the first etching condition is different from the second etching condition, causing the first work function layer in the first gate trench to contain metal dopants, with a first dopant concentration, that are left from the second work function layer etched in the first gate trench, and the first work function layer in the second gate trench to contain the metal dopants, with a second dopant concentration, that are left from the second work function layer etched in the second gate trench, wherein the first dopant concentration is different from the second dopant concentration;
- forming a first active gate structure and a second active gate structure in the first gate trench and the second gate trench, respectively, wherein the first active gate structure comprises the first work function layer and the metal dopants, with the first dopant concentration, that are left from the second work function layer in the first gate trench, and the second active gate structure comprises the first work function layer and the metal dopants, with the second dopant concentration, that are left behind from the second work function layer.

19. The method of claim 18, wherein the first and second active gate structures correspond to respective different threshold voltages.

20. The method of claim 18, wherein the metal dopants include tungsten (W).

* * * * *